(12) United States Patent
Wang et al.

(10) Patent No.: US 9,773,707 B2
(45) Date of Patent: Sep. 26, 2017

(54) METHOD FOR MANUFACTURING SEMICONDUCTOR DEVICE

(71) Applicant: INSTITUTE OF MICROELECTRONICS, CHINESE ACADEMY OF SCIENCES, Beijing (CN)

(72) Inventors: Guilei Wang, Beijing (CN); Jinbiao Liu, Beijing (CN); Jianfeng Gao, Beijing (CN); Junfeng Li, Beijing (CN); Chao Zhao, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 56 days.

(21) Appl. No.: 14/838,628

(22) Filed: Aug. 28, 2015

(65) Prior Publication Data

US 2016/0379829 A1 Dec. 29, 2016

(30) Foreign Application Priority Data

Jun. 23, 2015 (CN) .......................... 2015 1 0351481

(51) Int. Cl.
| | | |
|---|---|---|
| *H01L 21/8238* | (2006.01) | |
| *H01L 29/78* | (2006.01) | |
| *H01L 29/66* | (2006.01) | |
| *H01L 21/28* | (2006.01) | |
| *H01L 21/3215* | (2006.01) | |

(52) U.S. Cl.
CPC ........... *H01L 21/823828* (2013.01); *H01L 29/66545* (2013.01); *H01L 29/7845* (2013.01); *H01L 21/28079* (2013.01); *H01L 21/28088* (2013.01); *H01L 21/3215* (2013.01); *H01L 21/8238* (2013.01)

(58) Field of Classification Search
CPC ............ H01L 21/7845; H01L 29/7845; B81C 2201/0164; B81C 2201/0166
See application file for complete search history.

(56) References Cited

U.S. PATENT DOCUMENTS

| | | | | |
|---|---|---|---|---|
| 6,432,803 B1* | 8/2002 | Yamada | ............ | H01L 21/28088 257/E21.169 |
| 6,897,118 B1* | 5/2005 | Poon | ................... | H01L 29/6659 257/E21.324 |
| 2005/0095825 A1* | 5/2005 | Saito | ..................... | H01L 21/265 438/527 |
| 2008/0237661 A1* | 10/2008 | Ranade | ............ | H01L 21/26506 257/288 |
| 2011/0042728 A1* | 2/2011 | Cheng | ................. | H01L 21/0217 257/288 |

(Continued)

*Primary Examiner* — Brett Feeney
*Assistant Examiner* — Erik T Peterson
(74) *Attorney, Agent, or Firm* — McDermott Will & Emery LLP

(57) ABSTRACT

There is provided a method for manufacturing a semiconductor device, including: providing a semiconductor substrate having a plurality of openings formed thereon by removing a sacrificial gate; filling the openings with a top metal layer having compressive stress; and performing amorphous doping with respect to the top metal layer in a PMOS device region. Thus, it is possible to effectively improve carrier mobility of an NMOS device, and also to reduce the compressive stress in the PMOS device region to ensure a desired performance of the PMOS device.

10 Claims, 5 Drawing Sheets

(56) References Cited

U.S. PATENT DOCUMENTS

| | | | |
|---|---|---|---|
| 2011/0108928 A1* | 5/2011 | Tao | H01L 21/3215 257/410 |
| 2011/0143529 A1* | 6/2011 | Lee | H01L 21/28185 438/591 |
| 2011/0147804 A1* | 6/2011 | Mehandru | H01L 21/3215 257/255 |
| 2011/0156154 A1* | 6/2011 | Hoentschel | H01L 21/28079 257/369 |
| 2011/0254093 A1* | 10/2011 | Wang | H01L 21/823857 257/368 |
| 2013/0102142 A1* | 4/2013 | Lee | H01L 21/823807 438/591 |
| 2013/0240996 A1* | 9/2013 | Yin | H01L 21/823842 257/368 |
| 2014/0159211 A1* | 6/2014 | Lin | H01L 21/02164 257/632 |
| 2015/0035073 A1* | 2/2015 | Ando | H01L 21/28229 257/369 |
| 2015/0126023 A1* | 5/2015 | Choi | H01L 21/28158 438/591 |
| 2015/0187771 A1* | 7/2015 | Niimi | H01L 21/02164 257/369 |
| 2015/0318356 A1* | 11/2015 | Jia | H01L 21/043 257/29 |
| 2016/0149015 A1* | 5/2016 | Cai | H01L 29/66545 257/401 |

* cited by examiner

METHOD FOR MANUFACTURING SEMICONDUCTOR DEVICE

CROSS-REFERENCE TO RELATED APPLICATION(S)

This application claims priority to Chinese Application No. 201510351481.5, filed on Jun. 23, 2015, entitled "METHOD FOR MANUFACTURING SEMICONDUCTOR DEVICE," which is incorporated herein by reference in its entirety.

TECHNICAL FIELD

The present disclosure relates to the field of semiconductor device manufacture, and in particular, to a method for manufacturing a semiconductor device.

BACKGROUND

Currently, manufacture processes for advanced Complementary-Metal-Oxide-Semiconductor Field Effect Transistors (CMOS FETs) may be generally classified into two categories, i.e., Gate-First Process and Gate-Last Process.

The Gate-Last process is widely used in advanced integrated circuit manufacture. In this process, typically, a sacrificial gate and source/drain regions are formed and then the sacrificial gate is removed. A replacement gate stack comprising a high-K dielectric layer and a metal layer is then formed in a gate opening left due to removal of the sacrificial gate. As the gate is formed after the source/drain regions, it does not go through high-temperature annealing process, and thus materials for the gate can be more various and intrinsic characteristics of the materials can be exhibited more sufficiently.

With continuous scaling down of semiconductor devices, more critical requirements are proposed with respect to performances thereof. Stress Engineering has been employed to improve channel carrier mobility by introducing different stresses into respective channel regions of NMOS and PMOS devices, in order to enhance device performances. In the Gate-Last process, a metal material is typically filled in the opening left due to removal of the sacrificial gate to form a top metal gate electrode. It is desired to develop a filling method in formation of the replacement gate to further improve the channel carrier mobility for scaled-down devices.

SUMMARY

It is an object of the present disclosure to provide, among others, a method for manufacturing a device capable of introducing proper stress into devices.

According to an aspect of the present disclosure, there is provided a method for manufacturing a semiconductor device, comprising: providing a semiconductor substrate having a plurality of openings formed thereon by removing respective sacrificial gates; filling the openings with a top metal layer having compressive stress; and performing amorphization doping with respect to the top metal layer in a PMOS device region.

According to an embodiment, said filling the openings with a top metal layer may comprise filling the openings with a top metal layer of tungsten nitride having compressive stress by a PVD process.

According to an embodiment, said filling the openings with a top metal layer of tungsten nitride may comprise using a tungsten target and nitrogen as reaction sources in the PVD process to fill the openings with the top metal layer of tungsten nitride.

According to an embodiment, Ge may be used as dopants in the amorphization doping.

According to an embodiment, the amorphization doping may be performed with a doping energy of about 0.5-30 keV at a doping dosage of about 5E14-5E16/cm$^2$.

According to an embodiment, said filling the openings with a top metal layer and performing amorphization doping may comprise: filling in the openings a metal layer having compressive stress; performing planarization; forming a mask layer covering an NMOS region; performing the amorphization doping; removing the mask layer; and removing portions of the metal layer outside the openings to form the top metal layer in the openings.

According to an embodiment, before filling the openings with the top metal layer, the method may further comprise forming a high-K gate dielectric layer on inner walls of the openings and then performing thermal annealing.

According to an embodiment, the thermal annealing may be performed at a temperature of about 450° C. for about 15 seconds.

According to an embodiment, after forming the high-K gate dielectric layer and before filling the openings with the top metal layer, the method may further comprise: forming a metal barrier layer on the high-K gate dielectric layer; and forming a metal work function layer on the metal barrier layer.

According to an embodiment, the metal barrier layer may comprise TiN or WN.

According to the method for manufacturing the semiconductor device disclosed herein, the amorphization doping is performed with respect to the top metal layer having the compressive stress in the PMOS device region for the Gate-Last process. In this way, by only one top metal filling process, the top metal layer in the NMOS device region has the compressive stress, which may effectively improve carrier mobility of the NMOS device. Meanwhile, the compressive stress in the PMOS device region can be reduced due to the amorphization doping, which ensures high performance of the PMOS device.

BRIEF DESCRIPTION OF THE DRAWINGS

Next, the accompanying drawings will be described briefly in order to more clearly describe embodiments of the present disclosure or in the related art. Obviously, the accompanying drawings described below are merely some embodiments recited in the present disclosure. Other embodiments will be readily apparent to those skilled in the art in light of these accompanying drawings.

DETAILED DESCRIPTION

Embodiments of the present disclosure will be described in detail below in connection with the accompanying drawings to facilitate understanding of objects, characteristics, and advantages of the present disclosure.

Various specific details will be described in the below description for thorough understanding of the present disclosure, which, however, can be implemented by other embodiments different from those described herein. It is possible for those skilled in the art to envisage various variations or modifications in light of the present disclosure without departing from the spirit thereof. Therefore, the present disclosure is not limited to the following specific embodiments.

Also, the present disclosure is described in detail in conjunction with schematic diagrams. In describing the embodiments of the present disclosure in detail, for convenience of description, sectional views representing device structures are not necessarily drawn to scale, and may be locally enlarged. In addition, the diagrams are merely for illustration, instead of limiting the scope of the present disclosure. Further, in practical manufacture, three-dimensional sizes, i.e., length, width, and depth, should be included.

Figure 1:
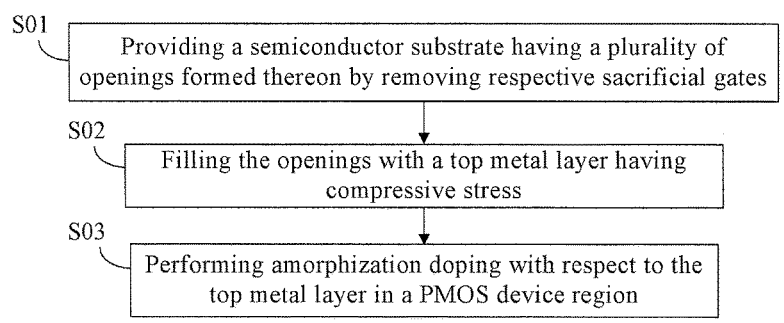
FIG. 1 is a flow chart schematically showing a method for manufacturing a semiconductor device according to an embodiment of the present disclosure.

According to embodiments of the present disclosure, there is provided a method for manufacturing a semiconductor device. As shown in FIG. 1, the method comprises: in step S01, providing a semiconductor substrate having a plurality of openings formed thereon by removing respective sacrificial gates; in step S02, filling the openings with a top metal layer having compressive stress; and in step S03, performing amorphization doping with respect to the top metal layer in a PMOS device region.

The method according to the present disclosure is applicable to the Gate-Last process. The amorphization doping is performed with respect to the top metal layer having the compressive stress in the PMOS device region. In this way, the top metal layer in the NMOS device region has the compressive stress, which may effectively improve carrier mobility of the NMOS device. Meanwhile, the compressive stress in the PMOS device region can be reduced due to the amorphization doping, which ensures high performance of the PMOS device.

According to some embodiments, the method may be applied to the Gate-Last process for FinFET devices or conventional planar devices. Next, an embodiment for manufacturing a FinFET device will be described in detail with reference to FIG. 1 for better understanding of the technical solution and effects of the present disclosure. Sectional views are taken along a fin direction.

Figure 2:
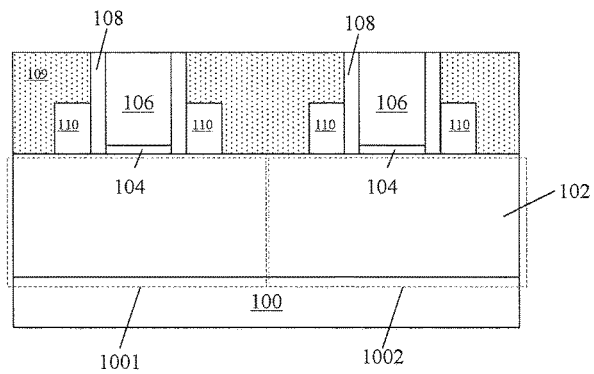
FIGS. 2-9 are sectional views, taken along a fin direction, schematically showing a semiconductor device in various stages of a method for manufacturing the semiconductor device according to an embodiment of the present disclosure.

First, as shown in FIG. 2, a semiconductor substrate 100 is provided with a plurality of devices having respective sacrificial gates formed thereon.

In an embodiment of the present disclosure, the semiconductor substrate 100 may comprise any one selected from a group consisting of a Si substrate, a Ge substrate, a SiGe substrate, an SOI (Silicon on Insulator) substrate, or a GOI (Germanium on Insulator) substrate, or other semiconductor material(s) or compound semiconductor material(s), e.g., GaAs, InP, or SiC. The substrate may have a stack structure, such as a Si/SiGe stack. The substrate may have an epitaxial structure, e.g., SGOI (Silicon and Germanium on Insulator).

In this embodiment, the semiconductor substrate 100 is a bulk silicon substrate having a PMOS device region 1001 for a PMOS device and an NMOS device region 1002 for an NMOS device.

In a specific embodiment, the devices with respective sacrificial gates may be formed as follows.

First, well regions (not shown) are formed by any known method in the bulk silicon substrate 100 by performing P-type doping for the N-type device and N-type doping for the P-type device.

Next, a fin 102 may be formed by etching the substrate 100 by, e.g., Reactive Ion Etching (RIE). Then, an isolation material, e.g., silicon dioxide, may be deposited and planarized by, e.g., Chemical Mechanical Polishing (CMP). The isolation material is then removed by a certain thickness through wet etching with, e.g., HF acid. Remained isolation material forms an isolation structure (not shown) between adjacent fins.

After that, a sacrificial gate dielectric layer and a sacrificial gate material are deposited and patterned to form a gate dielectric layer 104 and a sacrificial gate 106 on the fin. The sacrificial gate dielectric layer may comprise silicon oxide formed by thermal oxidation. The sacrificial gate material may comprise amorphous silicon or polysilicon. In this embodiment, the sacrificial gate material is amorphous silicon. Then, a spacer 108 is formed on sidewalls of each sacrificial gate. The spacer may have a single-layer or multi-layer structure, e.g., a silicon dioxide layer, a silicon oxynitride layer, a silicon nitride layer, or a stack of thereof. Next, source/drain regions are formed on portions of the fin on opposite sides of each sacrificial gate. In this embodiment, the source/drain regions 110 are formed on the end portions of the fin by Epitaxial growth (EPI) and doping in situ. Then, an interlayer dielectric layer of, e.g., undoped silicon oxide ($SiO_2$), doped silicon oxide (e.g., borosilicate glass or boron-phosphorosilicate glass), silicon nitride ($Si_3N_4$), or other low-k dielectric material, is deposited and planarized by, e.g., CMP until the sacrificial gates 106 are exposed to form an interlayer dielectric layer 109. In this way, the devices with respective sacrificial gates are formed for the Gate-Last process.

Figure 3:
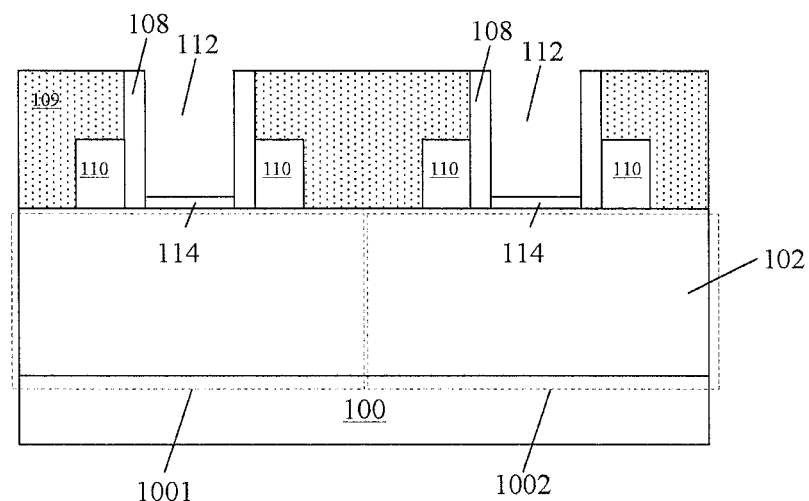

Then, the sacrificial gates are removed to form openings 112, as shown in FIG. 3.

In this embodiment, the sacrificial gates may be removed by wet etching. In an embodiment, the sacrificial gates 106 of amorphous silicon may be removed by a tetramethylammonium hydroxide (TMAH) solution at a certain concentration, and also the sacrificial gate dielectric layer 104 may be further removed, to form the openings 112. Next, after the sacrificial gate dielectric layer is removed, a gate dielectric layer may be newly formed to improve interfacial characteristics of the devices. In this embodiment, diluted BOE may be used to remove the sacrificial gate dielectric layer 104 and meanwhile form an interfacial oxide layer 114 on the surface of the fin, as shown in FIG. 3.

Figure 4:
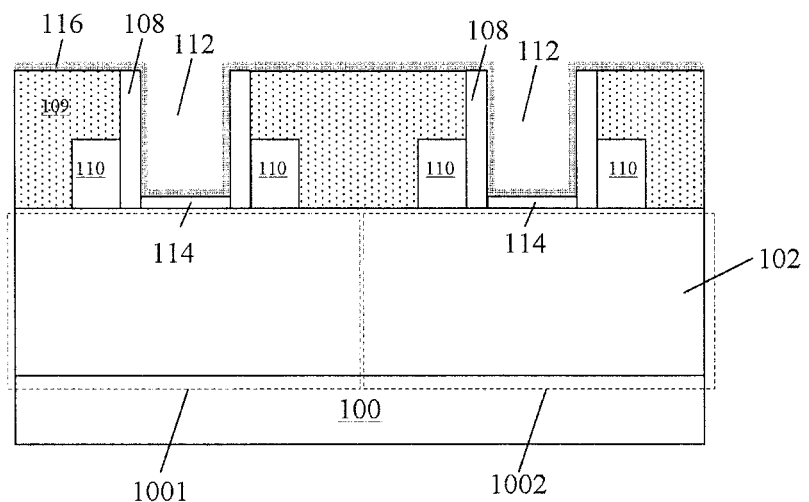

Then, a replacement gate dielectric layer 116 is deposited, as shown in FIG. 4. The replacement gate dielectric layer 116 may comprise a high-K dielectric material with a dielectric constant higher than that of, e.g., silicon oxide, or other suitable dielectric materials. The high-K dielectric material may comprise, e.g., Hf-based oxide, such as $HfO_2$, HfSiO, HfSiON, HfTaO, or HMO. Then, PDA (Post Deposition Anneal) thermal annealing may be performed at a temperature of about 450° C. for about 15 seconds.

Figure 5:
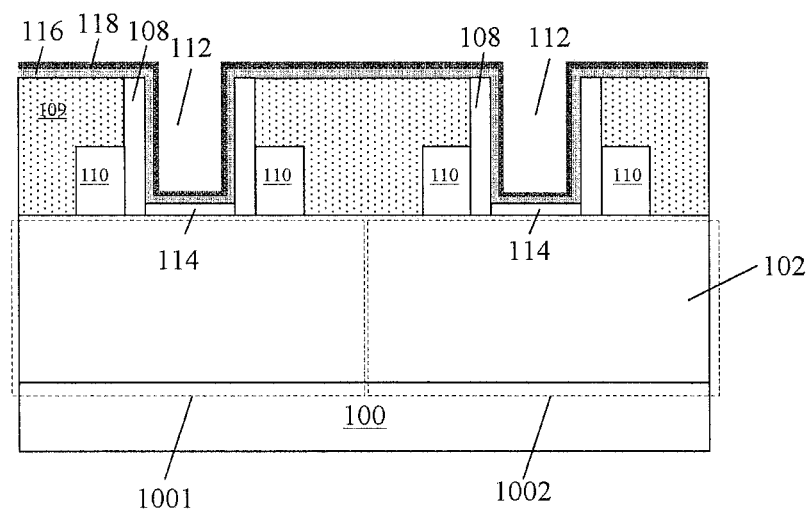
Figure 6:
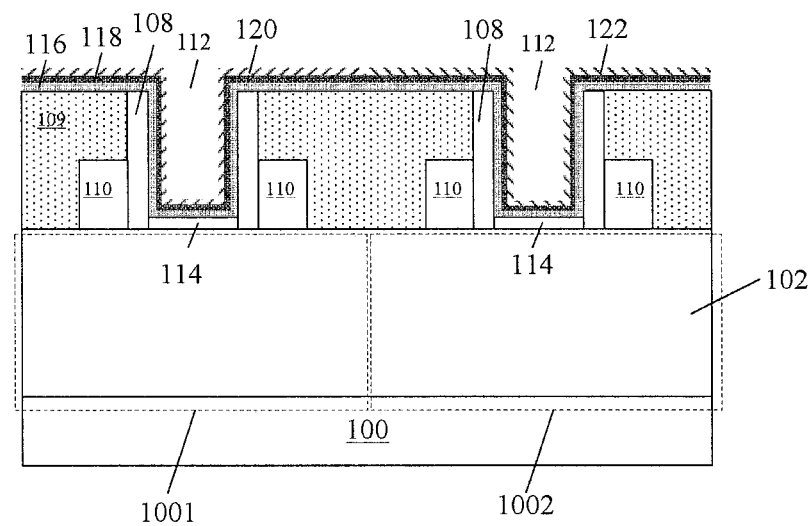

After that, a metal gate is deposited. The metal gate may comprise a plurality of metal layers selected from a group consisting of, e.g., Ti, $TiAl_x$, TiAlC, TiN, $TaN_x$, HfN, $TiC_x$, $TaC_x$, or W, etc. In this embodiment, the metal gate may comprise a metal barrier layer and a metal work function layer stacked in sequence. The metal work function layer may be formed separately for the NMOS device and the PMOS device to adjust respective work functions of the different devices to improve the performance of the devices. Specifically, first, as shown in FIG. 5, a metal barrier layer 118 comprising, e.g., TiN or WN, is deposited to prevent overlying metal ions from diffusing into the gate dielectric layer or even the channel. Then, as shown in FIG. 6, a first metal work function layer 120 is formed on the metal barrier layer 118 in the PMOS device region 1001, and a second metal work function layer 122 is formed on the metal barrier layer 118 in the NMOS device region 1002. The first metal work function layer 120 may comprise Ti or TiN, etc., to adjust the effective work function of the PMOS device. The second metal work function layer 122 may comprise TiAl or TiAlC, etc., to adjust the effective work function of the NMOS device.

Figure 7:
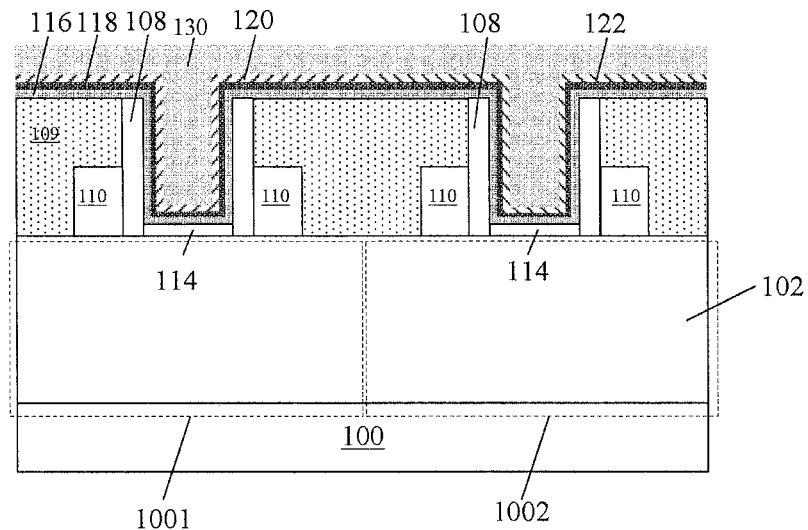

Then, as shown in FIG. 7, a top metal layer 130 is filled. The top metal layer 130 is filled only once. In certain processes, the filled top metal layer has compressive stress. Such metal layer may comprise, e.g., an AlN layer or a TiN layer formed by PVD or a WN layer formed by PVD.

In this embodiment, the top metal layer 130 is a tungsten nitride layer filled in the openings by PVD. Specifically, a high-purity tungsten target and nitrogen are used as reaction sources to fill the openings with tungsten nitride as the top metal layer 130. The top metal layer 130 is then planarized as shown in FIG. 7. The top metal layer 130 thus formed has a relatively high compressive stress.

In this embodiment, the top metal layer of tungsten nitride has the compressive stress along a direction perpendicular to the channel, which may improve the carrier mobility of the NMOS device but may degrade the performance of the PMOS device. The compressive stress is undesirable for the PMOS device.

Then, amorphization doping is performed with respect to the top metal layer 130 in the PMOS device region 1001.

Figure 8:
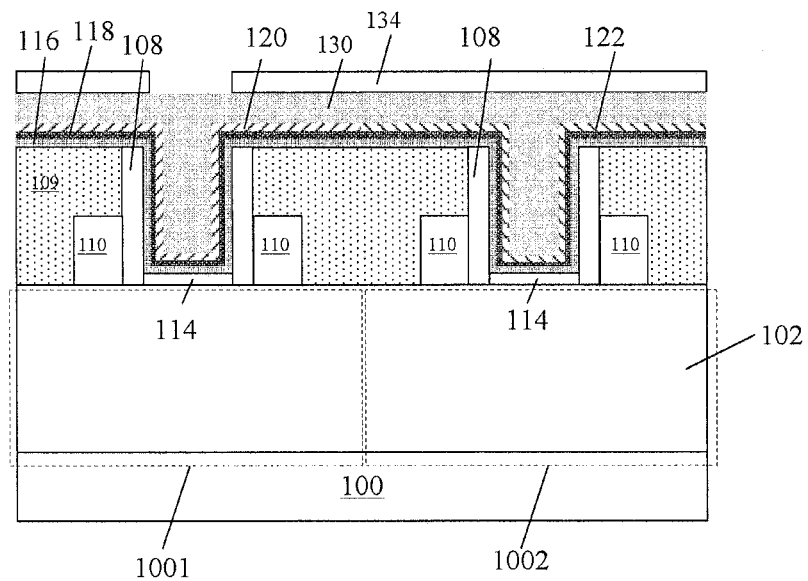
Figure 9:
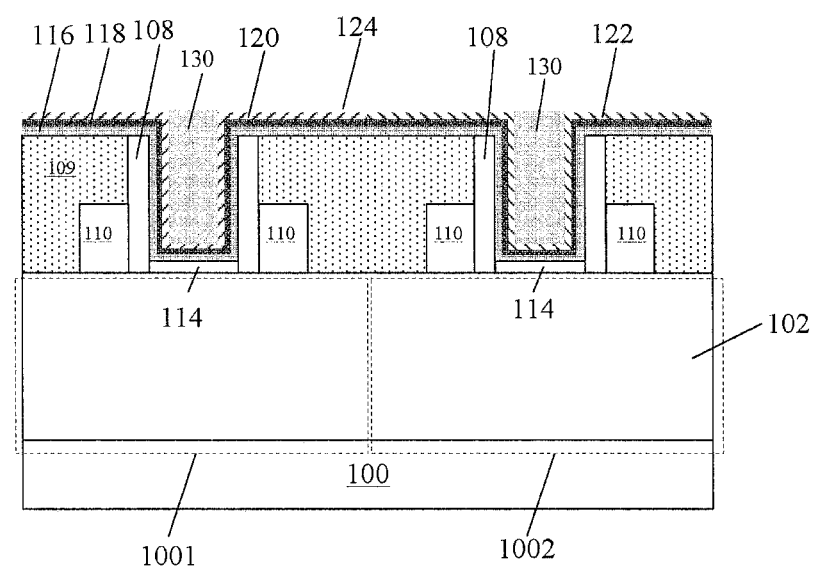

Specifically, first, a mask layer 134 is formed on the NMOS region 1002, as shown in FIG. 8. The mask layer 134 may comprise a hard mask or a photoresist layer. Then, the amorphization doping is performed with respect to the top metal layer 130 in the PMOS region 1001. Dopants for the amorphization doping may comprise Ge, N, or F, etc. The amorphization doping changes structural distribution of inner crystal lattice of the top metal layer 130 without altering electrical characteristics thereof. In this way, the compressive stress in the top metal layer 130 in the PMOS region 1001 can be released so that impacts on the channel of the PMOS device caused by the top metal layer 130 can be alleviated.

In this embodiment, the dopants for the amorphization doping may preferably be Ge. The amorphization doping may be performed with a doping energy of about 0.5-30 keV at a doping dosage of about $5E14$-$5E16/cm^2$.

Then, the mask layer 134 is removed and the metal work function layer is exposed by a planarization process. Thus, the top metal layer 130 of tungsten nitride is formed in the openings in the NOMS and PMOS device regions with different compressive stress.

As such, a semiconductor device is formed according to the embodiment of the present disclosure. Then, subsequent processes such as formation of contacts and interconnection structures can be performed as desired.

The foregoing merely illustrates some embodiments of the present disclosure instead of constituting any forms of limitations thereof.

Although the present disclosure has been described above with reference to the embodiments, the embodiments are not intended to limit the present disclosure. Various variations, modifications, and changes can be made therein in light of the method and contents described above, without departing from the scope of the present disclosure. Therefore, those variations, modifications, and changes should fall within the scope of the present disclosure.

We claim:

1. A method for manufacturing a semiconductor device, comprising the steps of:
providing a semiconductor substrate having a plurality of openings formed in an NMOS device region and a PMOS device region thereon by removing respective sacrificial gates for NMOS devices to be formed in the NMOS device region and PMOS devices to be formed in the PMOS device region;
filling the openings in both the NMOS device region and the PMOS device region with a top metal layer having compressive stress along a direction perpendicular to channels for the NMOS and PMOS devices; and
performing amorphization implantation with respect to the top metal layer in the PMOS device region to release the compressive stress in the top metal layer in the PMOS device region.

2. The method according to claim 1, wherein the step of filling the openings with a top metal layer comprises the step of:
filling the openings with a top metal layer of tungsten nitride having compressive stress by a PVD process.

3. The method according to claim 2, wherein the step of filling the openings with a top metal layer of tungsten nitride comprises the step of:
using a tungsten target and nitrogen as reaction sources in the PVD process to fill the openings with the top metal layer of tungsten nitride.

4. The method according to claim 2, wherein Ge is implanted in the amorphization implantation.

5. The method according to claim 4, wherein the amorphization implantation is performed with an implantation energy of about 0.5-30 keV at a dosage of about $5E14$-$5E16/cm^2$.

6. The method according to claim 1, wherein the step of filling the openings with a top metal layer and performing amorphization implantation comprises the steps of:
filling in the openings a metal layer having compressive stress;
performing planarization;
forming a mask layer covering the NMOS device region;
performing the amorphization implantation;
removing the mask layer; and
removing portions of the metal layer outside the openings to form the top metal layer in the openings.

7. The method according to claim 1, wherein before filling the openings with the top metal layer, the method further comprises the step of:
forming a high-K gate dielectric layer on inner walls of the openings and then performing thermal annealing.

8. The method according to claim 7, wherein the thermal annealing is performed at a temperature of about 450° C. for about 15 seconds.

9. The method according to claim 7, wherein after forming the high-K gate dielectric layer and before filling the openings with the top metal layer, the method further comprises the steps of:
forming a metal barrier layer on the high-K gate dielectric layer; and
forming a metal work function layer on the metal barrier layer.

10. The method according to claim 9, wherein the metal barrier layer comprises TiN or WN.

* * * * *